United States Patent [19]

Hayakawa et al.

[11] 4,120,041
[45] Oct. 10, 1978

[54] SEMICONDUCTOR DEVICE FOR USE IN AN ELECTRONIC APPARATUS HAVING A PLURALITY OF CIRCUIT BOARDS

[75] Inventors: Masao Hayakawa, Kyoto; Masahiro Nomura, Nara, both of Japan

[73] Assignee: Sharp Kabushiki Kaisha, Osaka, Japan

[21] Appl. No.: 747,059

[22] Filed: Dec. 3, 1976

[30] Foreign Application Priority Data

Dec. 5, 1975 [JP] Japan .................. 50-164505

[51] Int. Cl.² .................. G06F 15/00; H05K 1/04
[52] U.S. Cl. .................. 364/712; 361/400; 361/414
[58] Field of Search .......... 235/152, 156; 361/395, 361/399, 400, 401, 414; 364/712

[56] References Cited

U.S. PATENT DOCUMENTS

| 3,478,251 | 11/1969 | Perotto et al. | 361/395 |
| 3,588,616 | 6/1971 | Palazzini | 361/400 |
| 3,831,063 | 8/1974 | Keough | 361/399 X |
| 3,912,984 | 10/1975 | Lockhart, Jr. et al. | 361/400 |

*Primary Examiner*—Jerry Smith
*Attorney, Agent, or Firm*—Birch, Stewart, Kolasch & Birch

[57] ABSTRACT

In a semiconductor device of the Dual In-line Plug-in Package type, input terminals for receiving, for example, key input signals derived from key input means are aligned on a side of the semiconductor device, and output terminals for developing, for example, driving signals for display means are aligned on another side of said semiconductor device. The input terminals and the output terminals function, in combination, not only to electrically connect the key input means, the semiconductor device and the display means with one another, but also to mechanically connect a circuit board for supporting the key input means and another circuit board for supporting the display means with each other.

7 Claims, 7 Drawing Figures

SEMICONDUCTOR DEVICE FOR USE IN AN ELECTRONIC APPARATUS HAVING A PLURALITY OF CIRCUIT BOARDS

BACKGROUND AND SUMMARY OF THE INVENTION

The present invention relates to a semiconductor device for use in an electronic apparatus having a plurality of circuit boards and, more particularly, to a semiconductor device including a computation circuit of an electronic calculator which has two circuit boards, one for supporting key input means and the other for supporting display means.

In the conventional electronic calculator, key input means are supported on a first circuit board and display means are supported on a second circuit board. A semiconductor device made of, for example, an LSI, for performing the computation function, is mounted on either the first circuit board, second circuit board or another circuit board for supporting power supply means. Connectors are required to electrically communicate the respective circuit boards to each other.

Therefore, the fabrication of the electronics is unavoidably complicated, because many steps are required to connect respective terminals of the circuit boards and the connectors to each other. Moreover, the reliability of the electronics is unavoidably decreased.

Accordingly, an object of the present invention is to provide a semiconductor device suited for an electronic apparatus having a plurality of circuit boards disposed therein.

Another object of the present invention is to provide a semiconductor device for facilitating the fabrication of electronics of an electronic calculator having a plurality of circuit boards disposed therein.

Still another object of the present invention is to provide a semiconductor device which enhances the reliability of an electronic calculator having a plurality of circuit boards disposed therein.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, input terminals for receiving, for example, key input signals derived from key input means are aligned on a side of the semiconductor device of the Dual In-line Plug-in Package type, and output terminals for developing, for example, driving signals for display means are aligned on another side of said semiconductor device. The input terminals and the output terminals function, in combination, not only to electrically connect the key input means, the semiconductor device and the display means with one another, but also as connectors for performing electrical communication between a circuit board for supporting the key input means and another circuit board for supporting the display means. That is, the semiconductor device of the Dual In-line Plug-in Package type of the present invention is disposed in such a manner to extend between the two circuit boards for supporting the key input means and the display means, respectively.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Referring now in detail to the drawings, and to facilitate a more complete understanding of the present invention, a general circuit construction of an electronic calculator will be first described with reference to FIG. 1, and typical electrical communication in an electronic calculator of the prior art will be described with reference to FIGS. 2 and 3.

Figure 1:
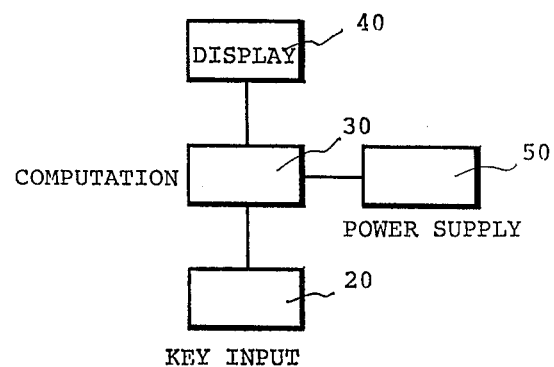
FIG. 1 is a schematic block diagram of an electronic calculator.

An electronic calculator generally comprises four blocks, namely, a key input unit 20, a computation function unit 30, a display unit 40 and a power supply unit 50 as shown in FIG. 1.

Figure 2:
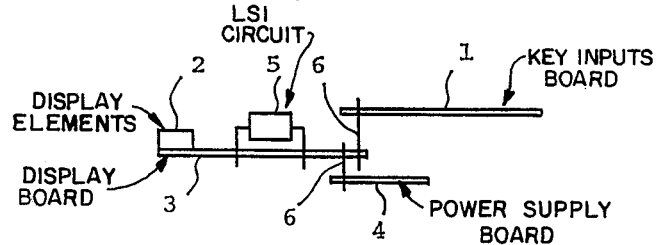
FIG. 2 is a schematic sectional view showing an example of communication of respective electronics in an electronic calculator of the prior art.
Figure 3:
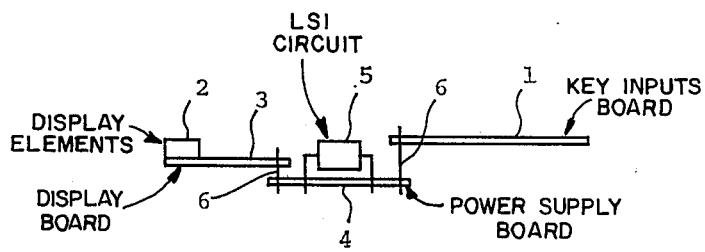
FIG. 3 is a schematic sectional view showing another example of communication of respective electronics in an electronic calculator of the prior art.

The key input unit is mainly made of a first circuit board 1, as shown in FIG. 2, for supporting key contact patterns formed thereon and associated with key tops secured by a calculator housing, thereby developing key input signals as is well known in the art. The display unit is usually made of display elements 2 mounted on a second circuit board 3. The power supply unit includes a battery secured on a power supply circuit board 4. The respective circuit boards 1, 3 and 4 are electrically connected to each other through the use of connectors 6. The computation function unit is made of an LSI 5. The LSI 5 is mounted on either the second circuit board 3 or the power supply circuit board 4 through the use of bonding technique in the conventional electronic calculator as shown in FIGS. 2 and 3.

In the above constructed electronic calculator of the prior art, connectors 6 are unavoidably required for electrically connecting the respective circuit boards. Therefore, the fabrication of the electronics is unavoidably complicated, because steps are required for connecting respective terminals of the circuit boards and the connectors to each other in addition to the bonding treatment for the semiconductor device including the computation function circuit.

Figures 4, 5:
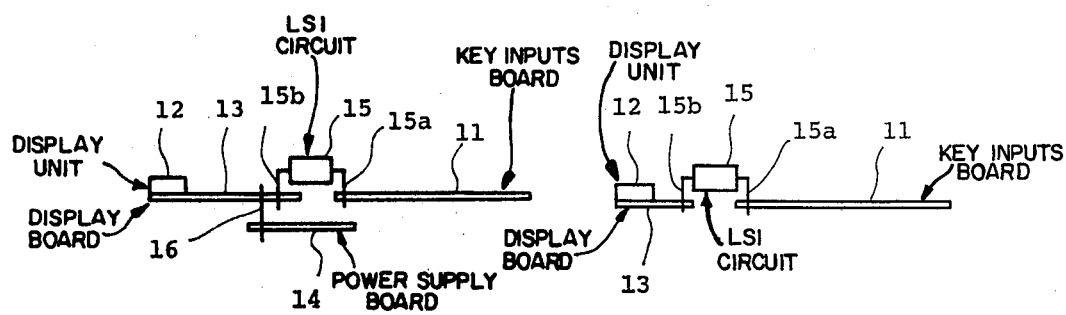
FIG. 4 is a schematic sectional view showing an example of communication of respective electronics in an electronic calculator having an embodiment of a semiconductor device of the present invention.
FIG. 5 is a schematic sectional view showing another example of communication of respective electronics in an electronic calculator having the semiconductor device of FIG. 4.

FIG. 4 shows a typical electronics assembly employing an embodiment of a semiconductor device of the present invention.

A first circuit board 11 includes key contact patterns and wiring patterns formed thereon. The key contact patterns are associated with key tops secured by a housing of an electronic calculator, whereby key input signals are derived at terminals formed at the edge of the circuit board 11 in response in depression of any one of the key tops. A display unit 12 is mounted on a second circuit board 13 so as to receive driving signals through terminals formed at the edge of the circuit board 13. The first circuit board 11 and the second circuit board 13 are disposed in the housing of an electronic calculator so that the terminals formed on both circuit boards 11 and 13 confront each other. The respective terminals formed at the edges of the circuit boards 11 and 13 are electrically and mechanically connected to each other via a computation function unit 15.

The computation function unit 15 is made of a semiconductor device of the Dual In-line Plug-in Package type, which includes one or more chips of LSI or IC therein. Input terminals 15a of the semiconductor device 15 are aligned on one side of the semiconductor device 15, which are connected to the terminals formed on the first circuit board 11, thereby receiving the key input signals. Output terminals 15b of the semiconductor device 15 are aligned on the other side of the semiconductor device 15, which are connected to the terminals formed on the second circuit board 13, thereby driving the display unit 12.

Needless to say, the LSIs or ICs contained within the Dual In-line Plug-in Package type semiconductor device are disposed so as to be electrically connected to the input terminals 15a and the output terminals 15b. The first circuit board 11 and the second circuit board 13 are electrically connected to each other through the semiconductor device 15, that is, the input terminals 15a and the output terminals 15b of the semiconductor device 15 function as connectors.

A power supply unit is mounted on a power supply circuit board 14, which is electrically connected to the second circuit board 13 via a connector 16. Alternatively, the power supply circuit can be omitted when the computation function unit 15 is made of, for example, complementary MOS integrated circuit and is driven directly by a power cell. In this case, the power supply circuit board 14 is not required and, therefore, the electronics are constructed as shown in FIG. 5. In this embodiment, the connectors are eliminated in the electronics, because the first circuit board 11 and the second circuit board 13 are electrically connected to each other through the use of the input and output terminals of the semiconductor device 15.

Thus constructed electronics are installed within a housing (not shown) of an electronic calculator as is well known in the art.

In the foregoing embodiments, the input terminals 15a and the output terminals 15b of the semiconductor device 15 are bent in the same directions. Alternatively, the input terminals 15a can be bent in the opposite direction to that of the output terminals 15b as shown in FIG. 6, thereby facilitating the installation of the respective circuit boards 11 and 13 within the housing of the electronic calculator.

Figures 6, 7:
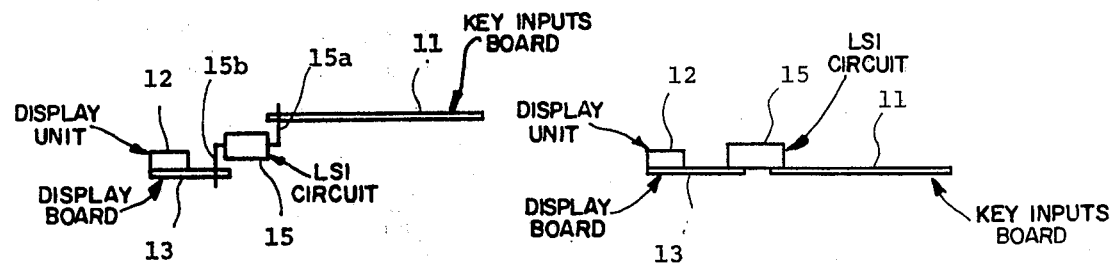
FIG. 6 is a schematic sectional view showing an example of communication of respective electronics in an electronic calculator having another embodiment of a semiconductor device of the present invention.
FIG. 7 is a schematic sectional view showing an example of communication of respective electronics in an electronic calculator having still another embodiment of a semiconductor device of the present invention.

FIG. 7 shows still another example, wherein the semiconductor device 15 does not have lead wires or terminals extending from the chip package, but has bumps formed on the chip package surface. The respective bumps are electrically connected to corresponding terminals formed on the first circuit board 11 and the second circuit board 13 through the use of bonding technique.

The invention being thus described, it will be obvious that the same may be varied in many ways. Such variations are not to be regarded as a departure from the spirit and scope of the invention, and all such modifications are intended to be included within the scope of the following claims.

What is claimed is:

1. In a semiconductor device for use in an electronic apparatus which includes information entry means mounted on a first circuit board and display means mounted on a second circuit board, the improvement comprising:

a Dual In-line Plug-in type package for containing the semiconductor device therein;

output terminals of the semiconductor device aligned on one side of the Dual In-line Plug-in type package;

input terminals of the semiconductor device aligned on the other side of the Dual In-line Plug-in type package; and means for installing the Dual In-line Plug-in type package to extend between the first circuit board and the second circuit board in such a manner that the output terminals of the semiconductor device are connected to the second circuit board and the input terminals of the semiconductor device are connected to the first circuit board both mechanically and electrically, respectively, to physically join said boards together through said package.

2. The semiconductor device of claim 1, wherein the first circuit board includes first terminals connected to the information entry means through wiring patterns formed on the first circuit board, and the second circuit board includes second terminals connected to the display means through wiring patterns formed on the second circuit board, said first terminals being electrically connected to the input terminals of the semiconductor device, and said second terminals being electrically connected to the output terminals of the semiconductor device.

3. Digital electronics circuitry comprising:

a first circuit board for supporting information entry means;

a second circuit board for supporting information output means;

a semiconductor device performing the computation function, and contained within a package;

input terminals of the semiconductor device aligned on one side of said package;

output terminals of the semiconductor device aligned on the other side of said package; and means for installing said package to extend between the first circuit board and the second circuit board in such a manner that the input terminals of the semiconductor device are connected to the first circuit board and the output terminals of the semiconductor device are connected to the second circuit board, said terminals comprising with said boards, respectively, to physically join said boards together through said package.

4. The digital electronics circuitry of claim 3, wherein the semiconductor device is contained within a Dual In-line Plug-in type package.

5. The digital electronics circuitry of claim 4, wherein the input terminals and the output terminals of the semiconductor device are bent in the same direction to facilitate the electrical and mechanical connection between the semiconductor device and the first circuit board, and between the semiconductor device and the second circuit board.

6. The digital electronics circuitry of claim 4, wherein the input terminals of the semiconductor device are bent in the opposite direction to that of the output terminals of the semiconductor device, thereby facilitating the electrical and mechanical connection among the semiconductor device, the first circuit board and the second circuit board.

7. The digital electronics circuitry of claim 3, wherein the first circuit board includes first terminals connected to the key input means through wiring patterns formed on the first circuit board, and the second circuit board includes second terminals connected to the display means through wiring patterns formed on the second circuit board, said first terminals being electrically and mechanically connected to the input terminals of a semiconductor device, and said second terminals being electrically and mechanically connected to the output terminals of the semiconductor device.

* * * * *